United States Patent [19]

Kim et al.

[11] Patent Number: 5,436,506
[45] Date of Patent: Jul. 25, 1995

[54] SEMICONDUCTOR MEMORY DEVICE AND THE MANUFACTURING METHOD THEREOF

[75] Inventors: Han-soo Kim, Suwon-city; Kyung-tae Kim, Seoul, both of Rep. of Korea

[73] Assignee: Samsung Electronics Co., Ltd., Suwon-City, Rep. of Korea

[21] Appl. No.: 134,815

[22] Filed: Oct. 12, 1993

[30] Foreign Application Priority Data

Oct. 12, 1992 [KR] Rep. of Korea ............... 1992 18694

[51] Int. Cl.⁶ ...................... H01L 27/02; H01L 29/04
[52] U.S. Cl. .................................. 257/347; 257/904; 257/758; 257/401; 257/903
[58] Field of Search ............. 257/903, 904, 758, 401, 257/393, 347, 366

[56] References Cited

U.S. PATENT DOCUMENTS 5,005,068 4/1991 Iheda et al. ................. 257/904

FOREIGN PATENT DOCUMENTS 63-296264 12/1988 Japan ................ 257/904

OTHER PUBLICATIONS

IBM Technical Disclosure Bulletin, vol. 33, #1B pp. 352–354 Jun. 1990 257/903.

Primary Examiner—Mark V. Prenty
Attorney, Agent, or Firm—Charles R. Donohoe; Robert A. Westerlund, Jr.; Stephen R. Whitt

[57] ABSTRACT

An SRAM memory cell structure is provided which has the access transistor gates formed from a different layer than that of the word line. The first access transistor gate of a first memory cell is connected to the first access transistor gate of an adjacent second memory cell, and a second access transistor gate of the first memory cell is connected to a second access transistor gate of an third oppositely adjacent memory cell. Each pair of coupled gates are formed separate from the access transistor gates in adjacent memory cells. The word lines connect the separated access transistor gates. The word lines are formed on an insulating layer above the gates of the access transistors. The word lines are, however, electrically connected to the gates of the access transistors through contact holes formed in the insulating layer. Each memory cell is arranged symmetrically with respect to an adjacent memory cell, and the components of each memory cell are symmetrical. Therefore, a structure and a method for a reduction in the area of an SRAM cell of the conventional circuit design is provided, resulting in a larger layout margin and a more reliable and more highly integrated SRAM device.

14 Claims, 14 Drawing Sheets

SEMICONDUCTOR MEMORY DEVICE AND THE MANUFACTURING METHOD THEREOF

FIELD OF THE INVENTION

The present invention relates to a semiconductor memory device and a manufacturing method thereof. More particularly, it relates to the structure of a cell of a static random access memory (SRAM) device.

BACKGROUND OF THE INVENTION

The conventional circuit of a cell of a static random access memory (SRAM) device is well known. It has two access transistors, two driver transistors (also known as "pull-down" transistors), and two load elements.

Three types of load elements are typically used in the conventional SRAM cell. These are: i) a depletion-type NMOS transistor; ii) a high-resistance polysilicon; or iii) a PMOS transistor.

The SRAM devices constructed of a CMOS process typically have PMOS transistor load elements. The PMOS load element provides for a memory device with low standby current and power consumption. However, the use of a PMOS transistor as the load element significantly enlarges the two-dimensional area required by a single SRAM memory cell, because of the formation of six transistors in the cell.

A conventional CMOS SRAM cell with PMOS transistor load elements comprises two NMOS access transistors, two NMOS driver transistors, and two PMOS transistors formed together on a semiconductor substrate.

The conventional CMOS SRAM cell with high-resistance polysilicon load elements has only four transistors formed for each cell. The high-resistance polysilicon load element is conventionally formed above the two NMOS access and two NMOS driver transistors.

Conventional SRAM cells have also been formed with two PMOS thin film transistors (TFT) as load elements laid over the conventional structure of two NMOS access and two NMOS driver transistors. The conventional layout of the two access and two driver transistors is illustrated in FIG. 1. However, the conventional PMOS TFT structure does not reduce the required area of an SRAM cell beyond that which was required by the SRAM device which uses high-resistance polysilicon load elements.

A CMOS SRAM memory cell using PMOS TFT load elements is illustrated in an NEC paper by H. Ohkubo et al. in IEDM '91 entitled "16 Mbit SRAM Cell Technologies for 2.0 V Operation". In this paper, an insulating film is deposited to form the PMOS TFT load elements within the area occupied by the access and driver transistors, but the use of the PMOS TFT does not reduce the required area of the conventional SRAM memory cell. A reduction in the area of each cell is required to achieve a higher integration of memory in a single device.

FIG. 1 illustrates the layout of the access and driver transistors of a conventional SRAM cell, such as in the Ohkubo paper and a Fujitsu paper by Kazuo Itabashi et al., in IEDM '91, entitled "A Split Wordline Cell for 16 Mb SRAM Using Polysilicon Sidewall Contacts". The SRAM cell comprises two word lines forming the gates of the access transistors, and the gates of the driver transistors and word lines are formed from the same layer.

A more complicated structure of an SRAM cell was by A. O. Adan et al. at the 1990 Symposium on VLSI Technology, in a paper entitled "A Half-micron SRAM Cell Using a Double-gated Self-aligned Polysilicon PMOS Thin Film Transistor (TFT) Load". In Adan's paper, the gates of the two access transistors are formed with a single word line. However, this more complicated structure has disadvantageous features, such as a higher amount of bird's beak into the active regions, ultimately resulting in a less reliable device.

There are two word lines which interconnect the memory cells in a conventional SRAM device, both serially connected to adjacent memory cells. The gates of the driver transistors, the gates of the access transistors, and the word lines are all formed by patterning the same conductive layer. Because the gates of the driver transistors are located on the same layer but between the word lines, the minimum area of the memory cell is dictated by the minimum size of these common layer components.

Therefore, because the word line is formed from the same layer as the gate of the driver transistor, it is difficult to achieve further significant reductions in the size of the memory cell with the structure of the conventionally known SRAM device.

SUMMARY OF THE INVENTION

One object of the present invention is to provide an SRAM device wherein the gates of the access transistors are formed from a different conductive layer than that of the word lines.

Another object of the present invention is to provide an SRAM device in which the area occupied by the memory cell is minimized.

A further object of the present invention is to provide a manufacturing method suitable for carrying out the above objects.

The present invention achieves these objects by providing a structure of an SRAM device which, while utilizing PMOS TFT load elements, the gate of the access transistor is formed from a different layer than that of the word line. This allows for the resulting reduction in the size of the memory cell.

The word line of this invention is formed on an insulating layer which insulates it from the gates of the access transistors. The wordline is, however, electrically connected to the gates of the access transistors through contact holes formed in the insulating layer.

Each memory cell is arranged symmetrically with respect to an adjacent memory cell, and the components of each memory cell are symmetrical.

BRIEF DESCRIPTION OF THE DRAWINGS

The above objects and other advantages of the present invention will become more apparent by describing in detail a preferred embodiment thereof with reference to the attached drawings in which.

DESCRIPTION OF PREFERRED EMBODIMENTS

The preferred embodiments of the present invention will now be described in more detail, referring to the attached drawings.

Figure 2:
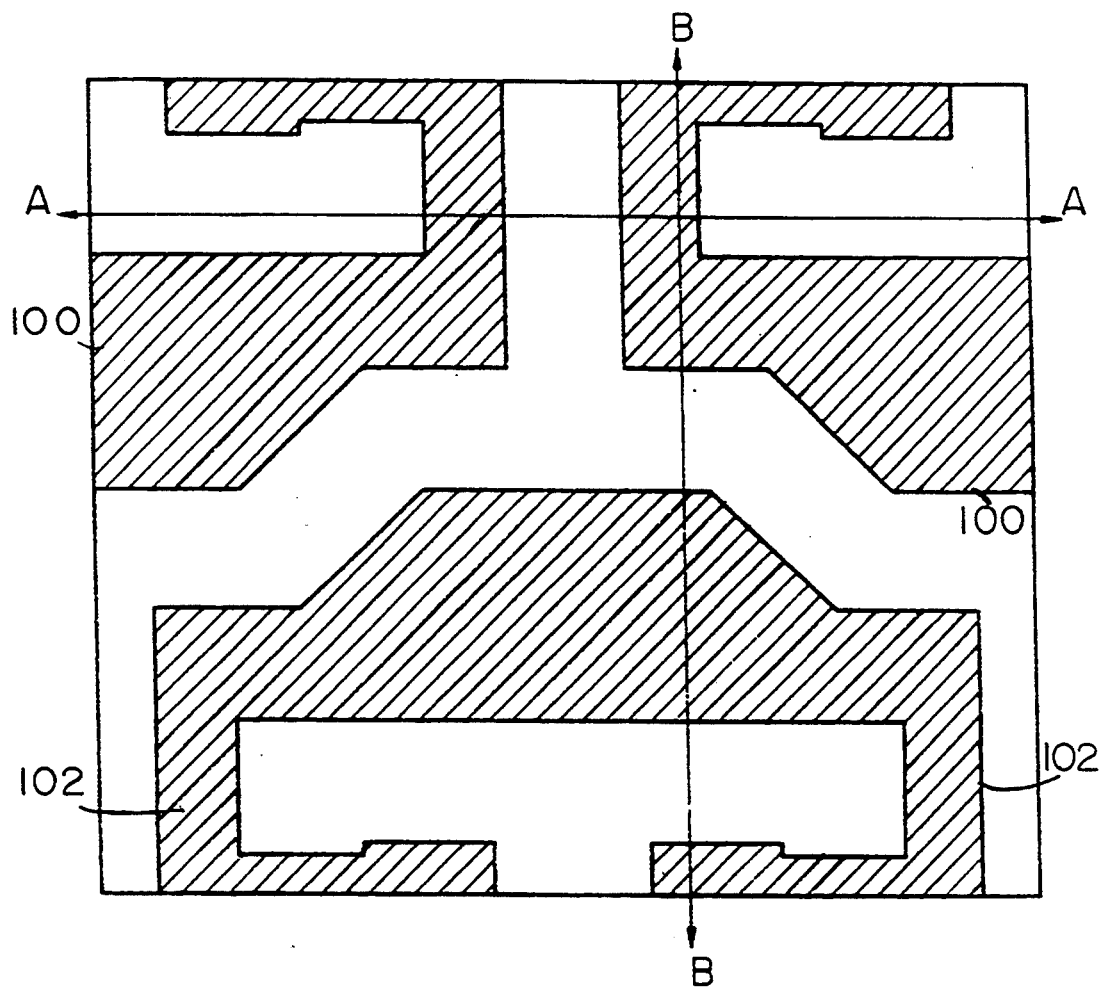
FIGS. 2 to 11 are diagrams showing the layout of a symmetrical pair of SRAM cells according to the present invention, wherein the gates of the access transistors and the word lines are formed from different layers.
Figure 12:
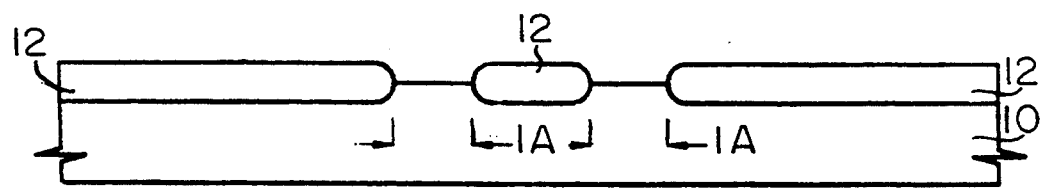
FIGS. 12 to 21 are cross-sectional views taken along lines AA' of each of FIGS. 2 to 11, respectively, for illustrating the method for manufacturing the semiconductor memory device according to the present invention.
Figure 22:
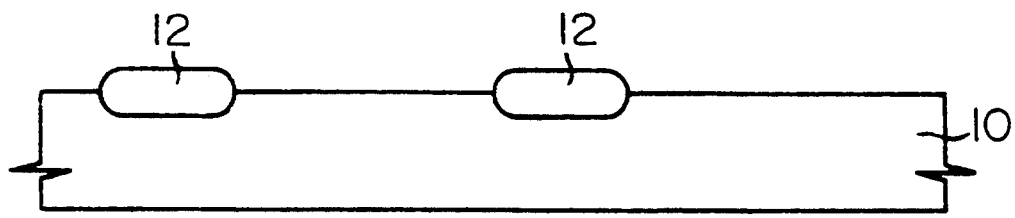
FIGS. 22 to 31 are cross-sectional views taken along lines BB' of each of FIGS. 2 to 11, respectively, for illustrating the method for manufacturing the semiconductor memory device according to the present invention.

Referring to FIGS. 2, 12 and 22, a pad oxide film (not shown) and a nitride film pattern (not shown) are sequentially formed on a semiconductor substrate 10. The substrate 10 is then oxidized by the nitride film pattern according to a conventional selective oxidation processes, using mask patterns 100 and 102, thus forming a field oxide film 12 defining a first active region and a second active region. The first active region is in the upper portion of the cell, and the second active region is in the lower portion of the cell. Thereafter, the nitride film pattern and the pad oxide film are removed.

The first and second active regions are symmetrical but offset to each other, and the active regions of adjacent memory cells are symmetrical. The components of the memory cells are also symmetrical to one another.

Figure 3:
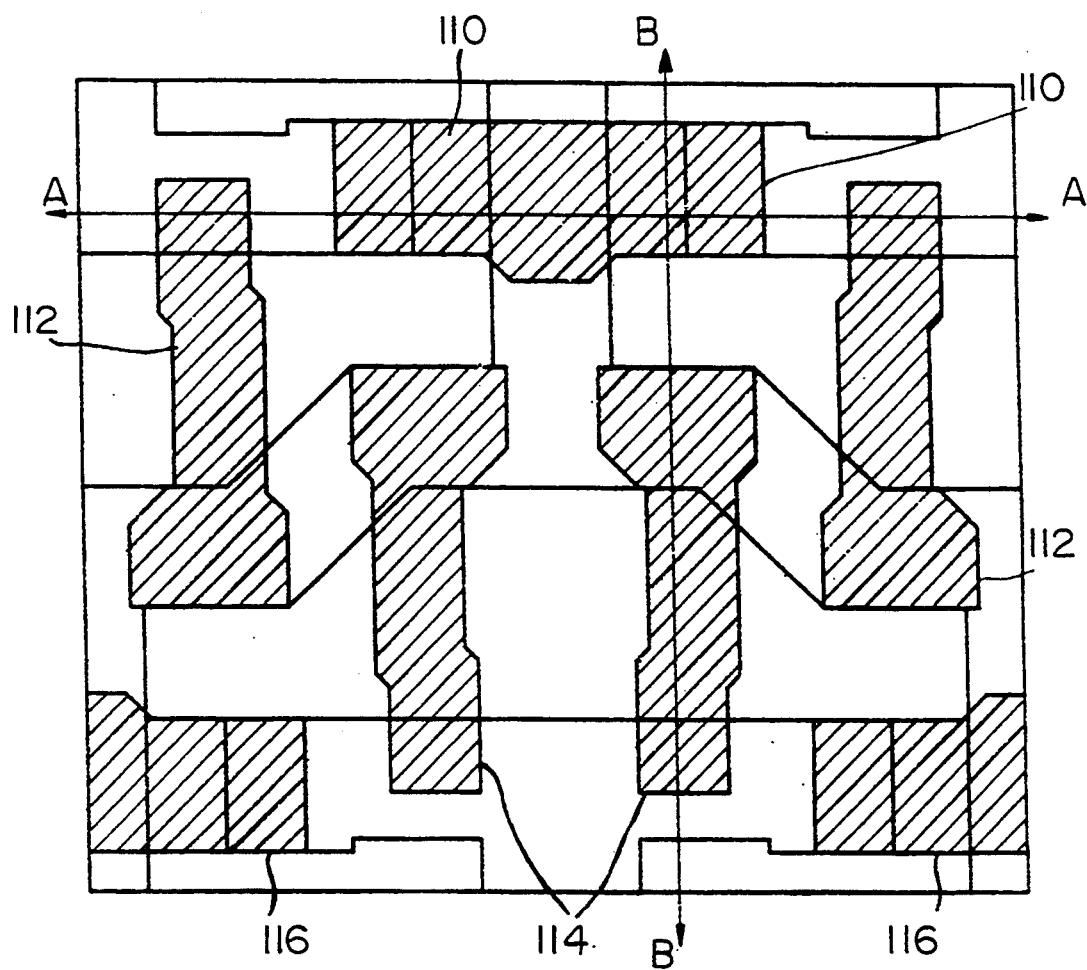
Figure 13:
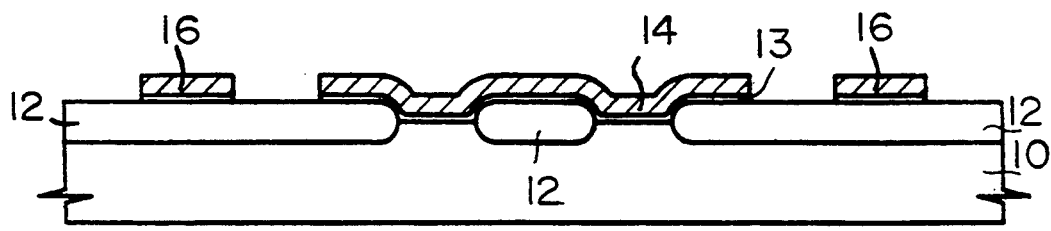
Figure 23:
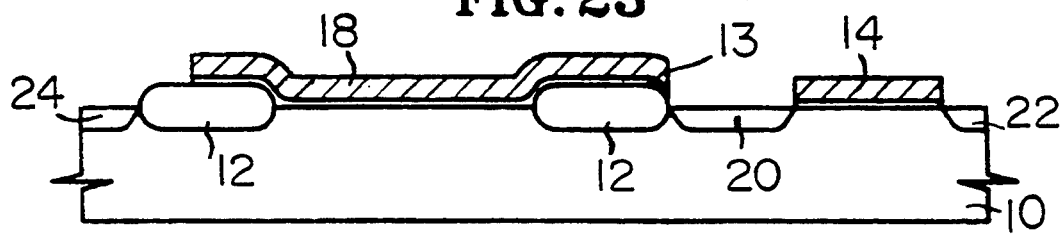

FIGS. 3, 13, and 23 illustrate the step of forming the first and second access transistors, and the first and second driver transistors.

A gate insulating film 13 is formed over the entire surface of the semiconductor substrate 10 where the field oxide film 12 is formed, for insulating the gates of the first and second access and first and second driver transistors. Then a conductive material, e.g., polysilicon or a lamination of polysilicon and silicide, is deposited over the gate insulating film 13 to form the first conductive layer (not shown). The first conductive layer is then patterned by a photo-etching process using mask patterns 110, 112, 114 and 116, forming the gate 14 of the first access transistor, the gate 16 of the first driver transistor, the gate 18 of the second driver transistor and the gate (not shown) of the second access transistors. The gate 14 of the first access transistor is disposed near the upper edge of each memory cell, extending across the first active region and connecting to the gate of the first access transistor of an adjacent memory cell. This pair of connected gates is separate from the gates of adjacent memory cells.

The gate 16 of the first driver transistor is disposed toward the center portion of each memory cell, extending across the first active region perpendicular to the gate 14 of the first access transistor.

The gate 18 of the second driver transistor is also disposed in the center portion of each memory cell, but parallel to the gate 16 of the first driver transistor. The gate 18 extends across the second active region.

The gate (not shown) of the second access transistor is disposed near the lower edge of each memory cell, extending across the second active region and connecting to the gate of a second access transistor in an oppositely adjacent memory cell. These connected gates are separate from the gates of the other adjacent memory cells.

An impurity, e.g., phosphorus or arsenic, is then ion-implanted on the surface of the resultant substrate where the gates of the transistors are disposed, to form i) the source 20 and drain 22 of the first access transistor, ii) the source (not shown) and drain 20 of the first driver transistor, iii) the source and drain (not shown) of the second driver transistor, and iv) the source (not shown) and drain 24 of the second access transistor. The sources and drains of the individual transistors may be reversed with respect to one another.

The source 20 and drain 22 of the first access transistor, and the source and drain 20 of the first driver transistor are arranged in the first active region. The source 20 of the first access transistor and the drain 20 of the first driver transistor are in a common region.

The source and drain of the second driver transistor, and the source and drain 24 of the second access transistor, are arranged in the second active region. The drain of the second driver transistor and the source of the second access transistor are in a common region.

Figure 1:
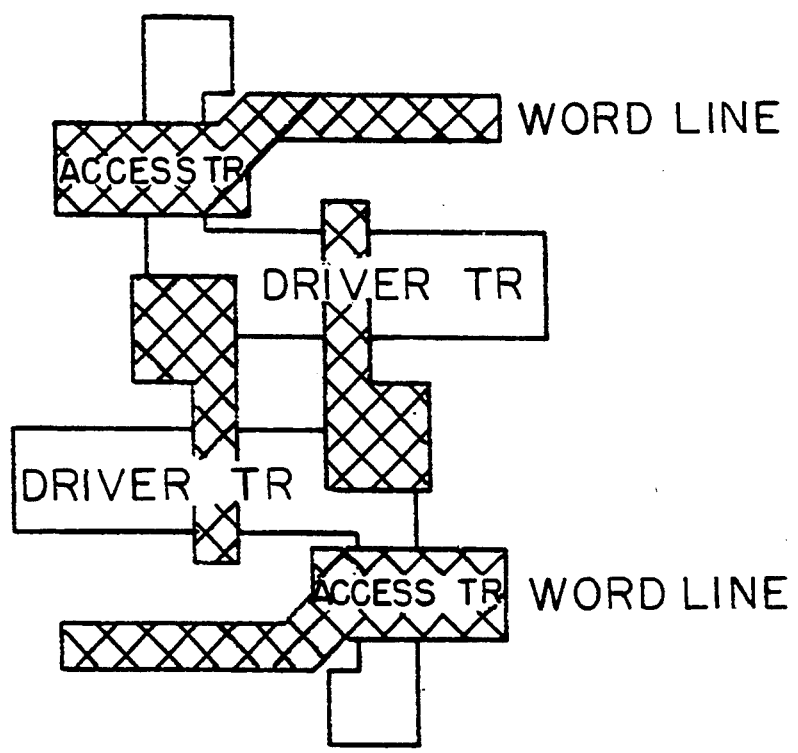
FIG. 1 is a diagram of the layout of the conventional SRAM cell showing the gate of an access transistor and a word line formed from the same layer.

The layout of the conventional SRAM cell, as illustrated in FIG. 1, is formed such that the gates of the access transistors are respectively near the edge of the upper and lower parts of each memory cell, to connect to adjacent memory cells throughout the memory cell array. In the layout of the present invention, as illustrated in FIG. 3, the gate 14 of the first access transistor is connected to the gate 14 of a first access transistor of one adjacent memory cell, while the gate of the second access transistor arranged in the lower part of a memory cell is connected to the gate of a second access transistor in an oppositely adjacent memory cell. Each gate couples directly to the respectively adjacent memory cell, and to no others.

The structure of the present invention, with the gates of the access transistors connected to adjacent memory cells, reduces the area of the memory cell but does not change the circuit of the conventional SRAM memory cell.

Figure 4:
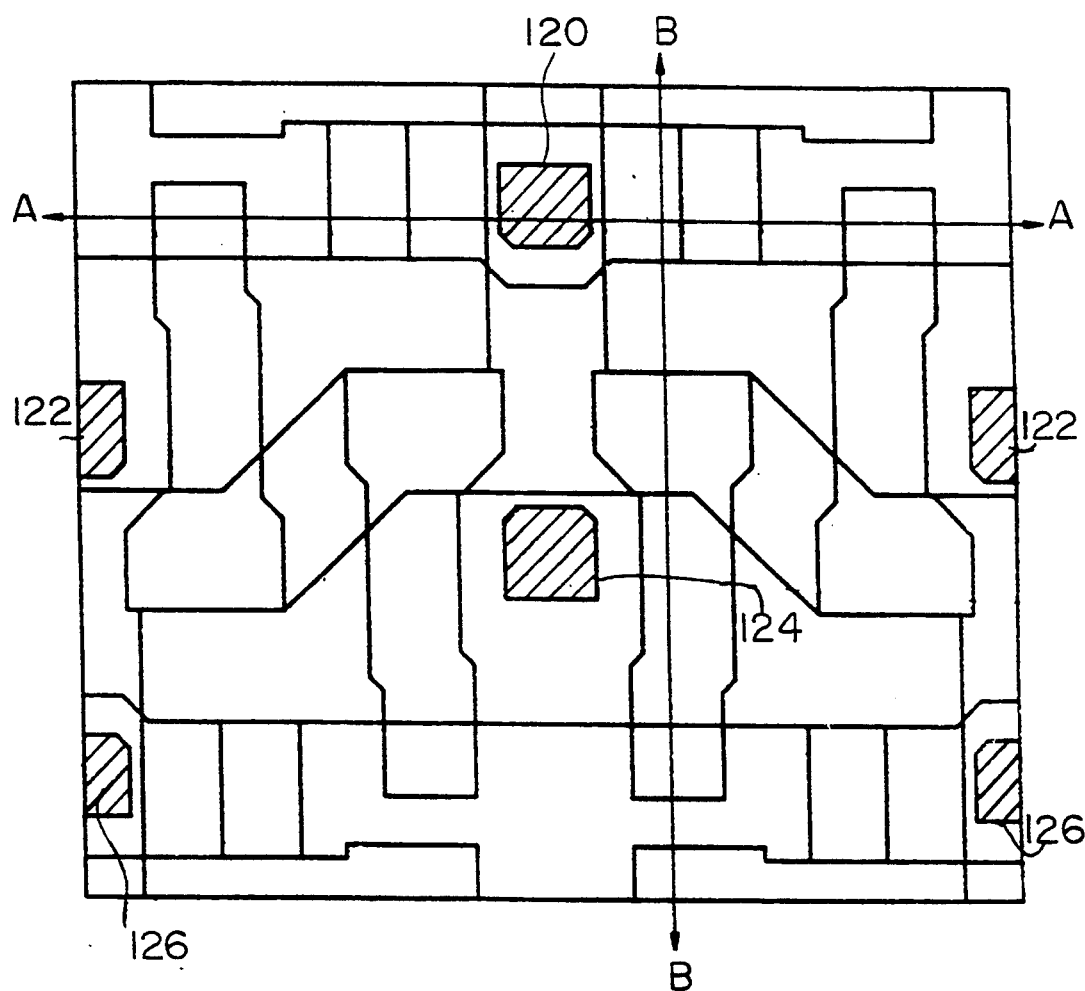
Figure 14:
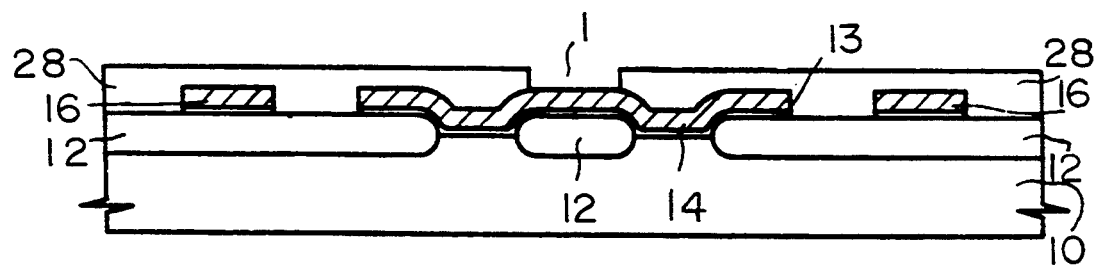
Figure 24:
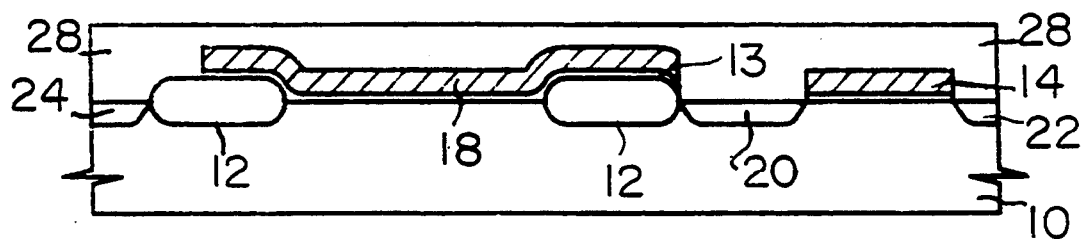

Referring to FIGS. 4, 14 and 24, a first insulating layer 28 is formed over the entire surface of the resultant substrate. The first insulating layer 28 insulates the gates of the transistors from the word line formed in a subsequent process step. It is formed from a monolayer of an oxide film, e.g., a high-temperature oxide (HTO) film. An insulating material, e.g., boro-phosphor-silicate glass (BPSG), can be laid over the surface of the first insulating layer 28 to planarize it.

The first insulating layer 28 is then selectively removed by a photo-etching process using mask patterns 120, 122, 124 and 126 to form, respectively, a first, second, third and fourth contact hole. The first contact hole 1 exposes the first access transistor gate 14, the second contact hole exposes the first driver transistor source, the third contact hole exposes the second driver transistor source, and the fourth contact hole exposes the second access transistor gate.

Figure 5:
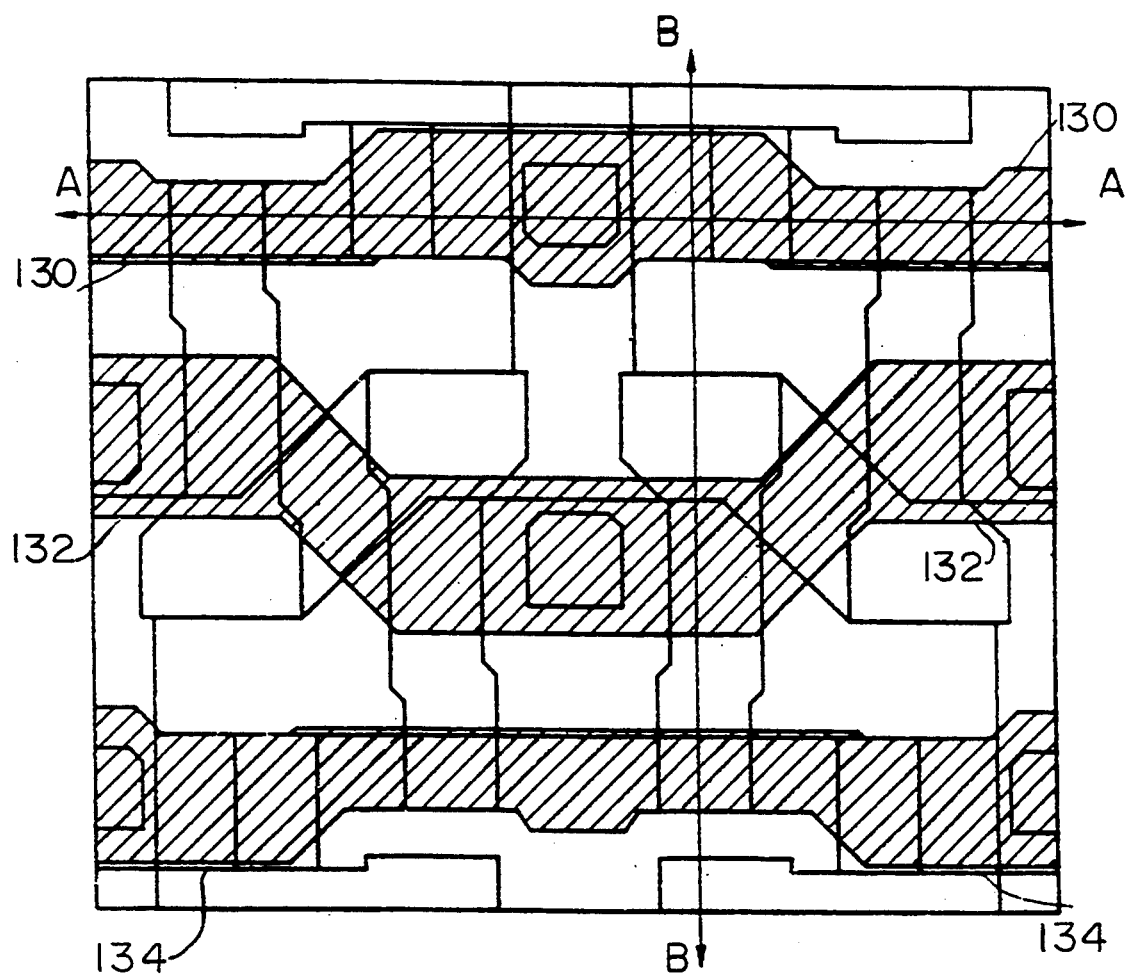
Figure 15:
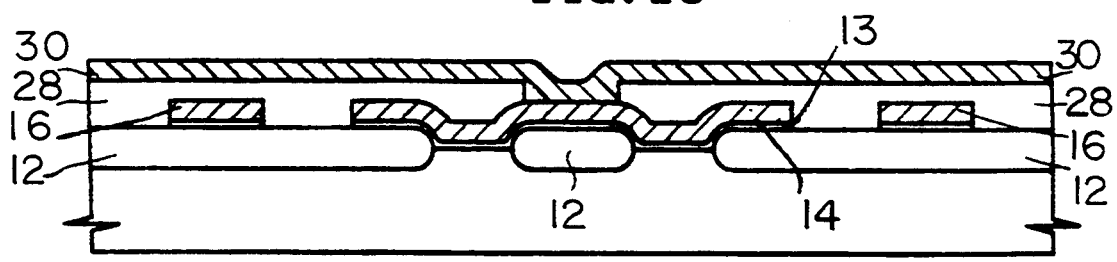
Figure 25:
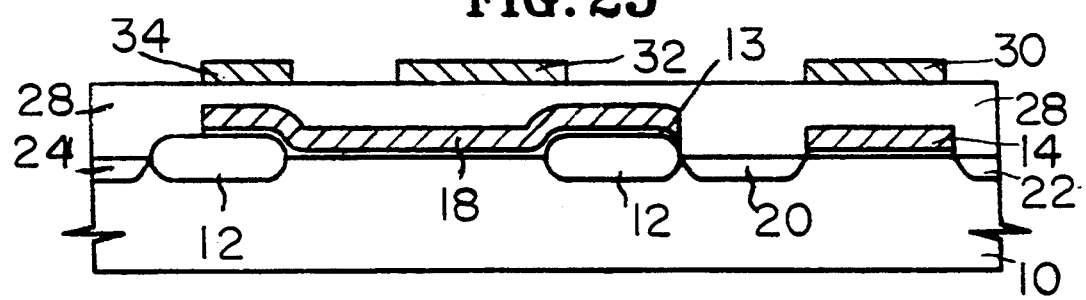

Referring to FIGS. 5, 15 and 25, a second conductive layer (not shown) is formed by depositing a conductive material, e.g., polysilicon or a lamination of polysilicon and silicide, over the surface of the resultant substrate where the contact holes were formed. The second conductive layer is then patterned by a photo-etching process, using mask patterns 130, 132 and 134, to form the first word line 30, the first power supply line 32, and the second word lines 34, respectively.

The first word line 30 is connected to the first access transistor gate 14 through the first contact hole 1, and the second word line 34 is connected to the second access transistor gate through the fourth contact hole.

The first power supply line 32 is connected to the first and second driver transistor sources through the second and third contact holes, respectively. In the present embodiment, the first power supply line 32 is ground.

As can be seen in FIG.15, the gates of first and second access transistors and the gates of the first and second driver transistors are disposed on the gate insulating film 13, and the first and second word lines 30, 34 are disposed on the first insulating layer 28.

The circuit of the conventional SRAM cell is accomplished by the present invention because the first and second word lines 30, 34 are respectively connected to the gates of the first and second access transistors. The gates of the access transistors are formed from the first conductive layer, while the word lines are formed from the second conductive layer, linking each separated pair of gates of access transistors.

Figure 6:
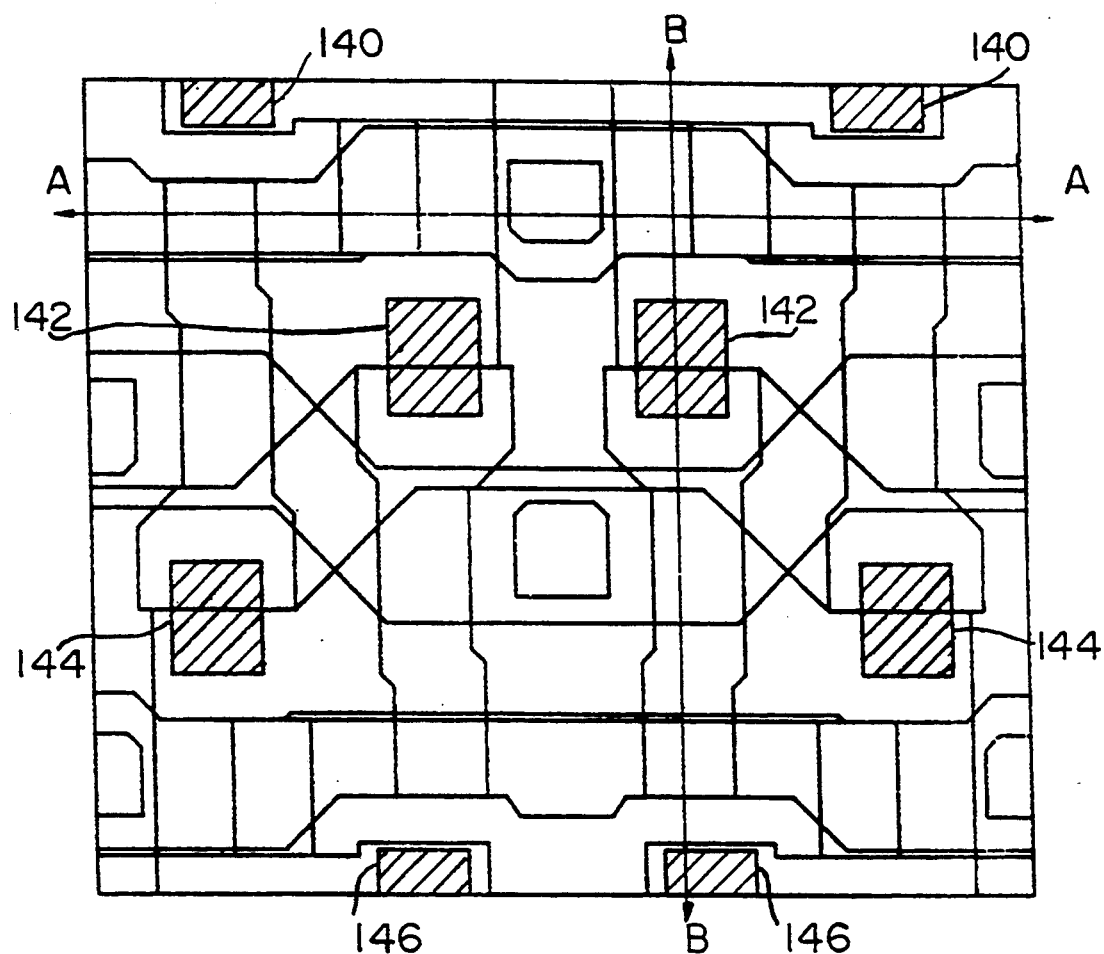
Figure 16:
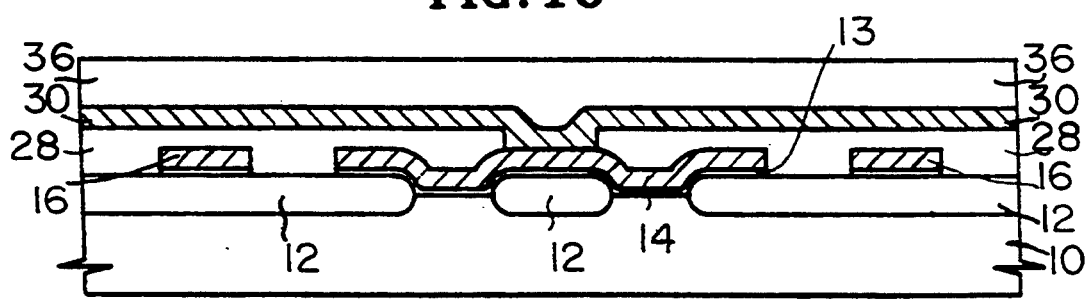
Figure 26:
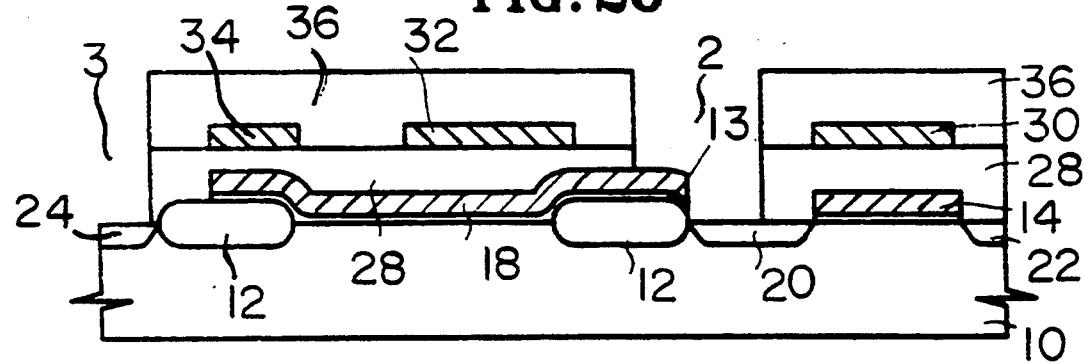

Referring to FIGS. 6, 16 and 26, a monolayer of oxide film, e.g., the HTO film, is deposited over the entire surface of the resultant structure to form a second insulating layer 36. The surface of the second insulating layer 36 may be planarized with the lamination of BPSG as an insulating material.

The second insulating layer 36 is then selectively removed using a photo-etching process with mask patterns 140, 142, 144 and 146. The photo-etching process forms the fifth (not shown), sixth 2, seventh and eighth contact holes which expose, respectively, i) the first access transistor drain 22, ii) the second driver transistor gate 18 and first driver transistor drain, iii) the first driver transistor gate 16 and second driver transistor drain, and iv) the second access transistor drain 24.

The fifth contact hole (not shown) is for connecting a first pad 40 with the first access transistor drain 22. The sixth contact hole 2 is for connecting the second PMOS TFT gate 42 with the second driver transistor gate 18 and first driver transistor drain 20. The seventh contact hole (not shown) is for connecting the first PMOS TFT gate 44 with the first driver transistor gate 16 and second driver transistor drain, and the eighth contact hole 3 is for connecting a second pad 46 with the second access transistor drain 24. The mask patterns 140, 142, 144 and 146 are used for forming the respective fifth through eighth contact holes.

Figure 7:
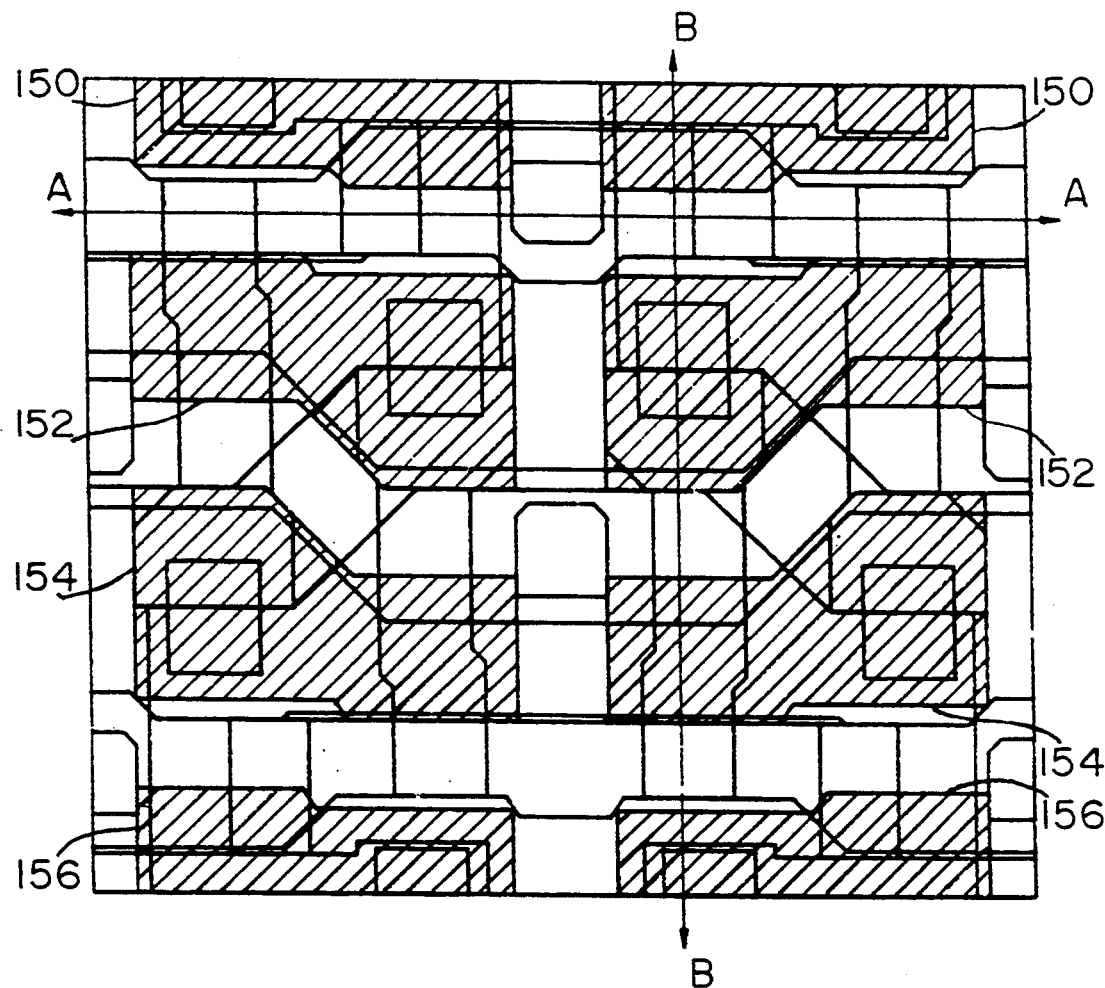
Figure 17:
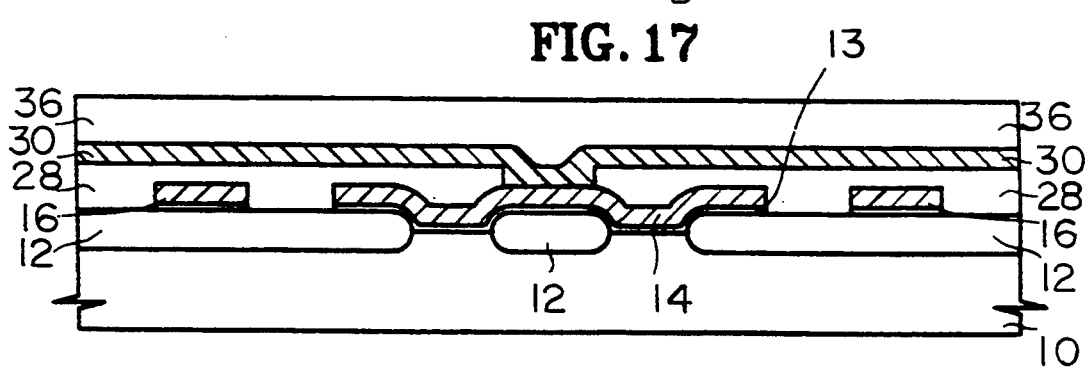
Figure 27:
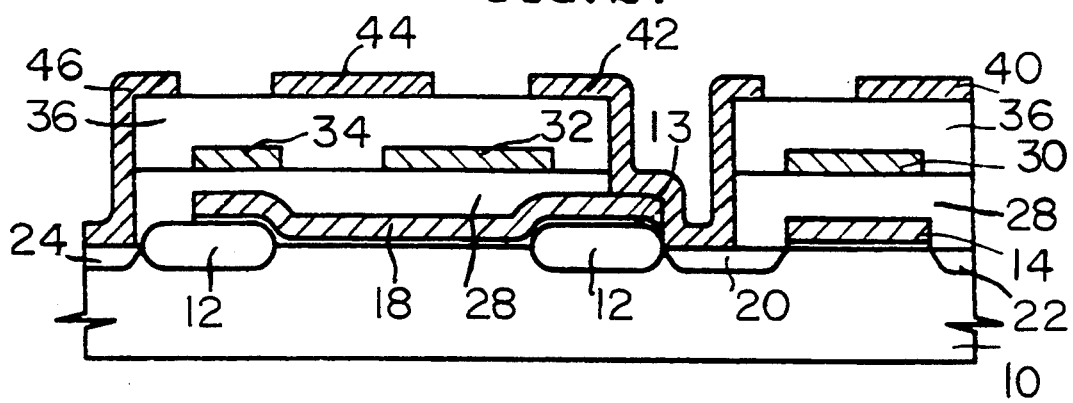

Referring to FIGS. 7, 17 and 27, a conductive material, e.g., polysilicon, is deposited over the entire surface of the resultant structure. The polysilicon is then patterned by a photo-etching process using mask patterns 150, 152, 154 and 156, thus forming the first and second pad 40, 46, and gates, 44 and 42 respectively, for the first and second PMOS TFT.

The first pad 40, disposed parallel to the first word line 30, is connected to the first access transistor drain 22 through the fifth contact hole. The first pad 40 contacts a first bit line formed in a subsequent step.

The second PMOS TFT gate 42, disposed parallel to the first pad 40, is connected to the second driver transistor gate 18 and the first driver transistor drain 20 through the sixth contact hole 2.

The first PMOS TFT gate 44, also disposed parallel to the first pad 40, is connected to the first driver transistor gate 16 and to either the second driver transistor drain or the first access transistor source 20 through the seventh contact hole.

The second pad 46, disposed parallel to the first pad 40, is connected to the second access transistor drain 24 through the eighth contact hole 3. The second pad 46 contacts a second bit line formed a subsequent step.

The first PMOS TFT gate 44 is formed perpendicular to the second driver transistor gate 18. The second PMOS TFT gate 42 is formed perpendicular to the first driver transistor gate 16.

Figure 8:
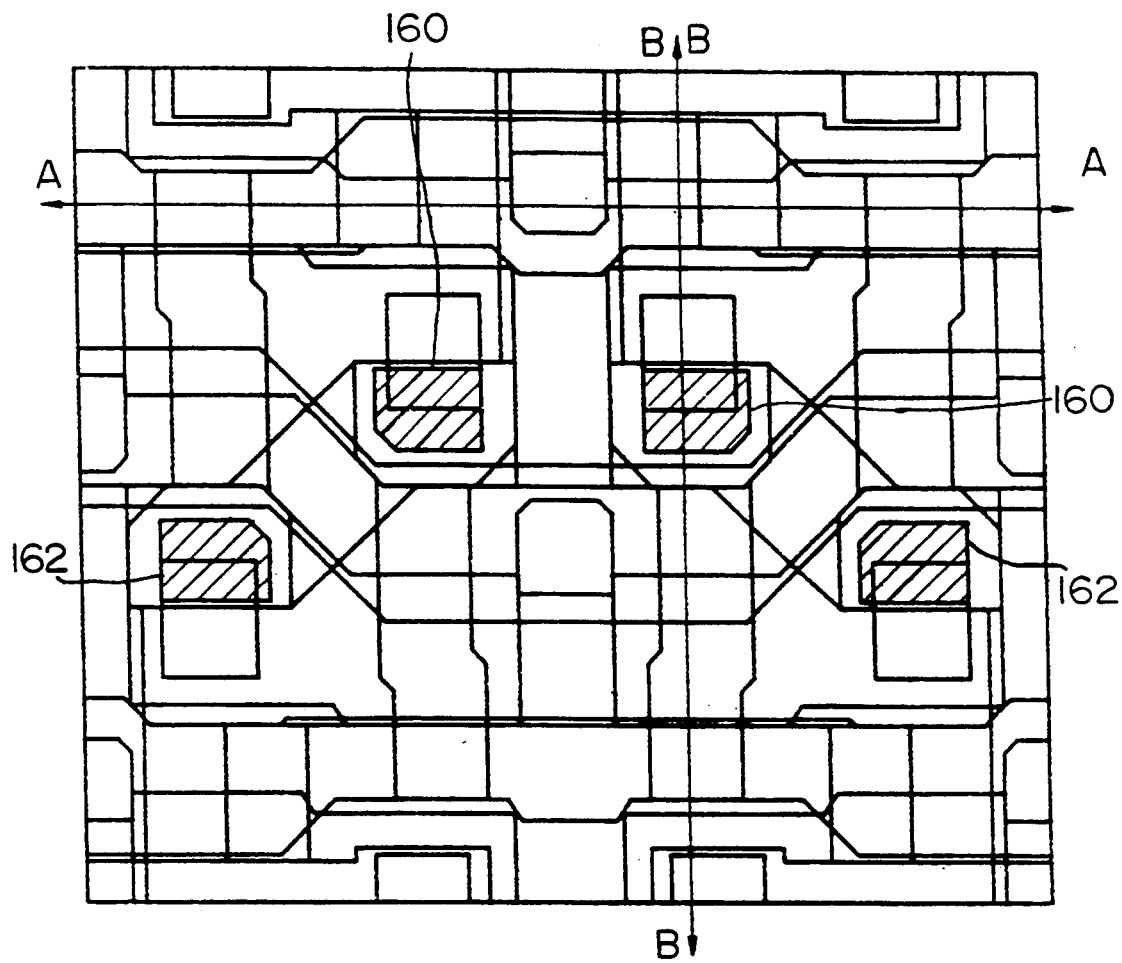
Figure 18:
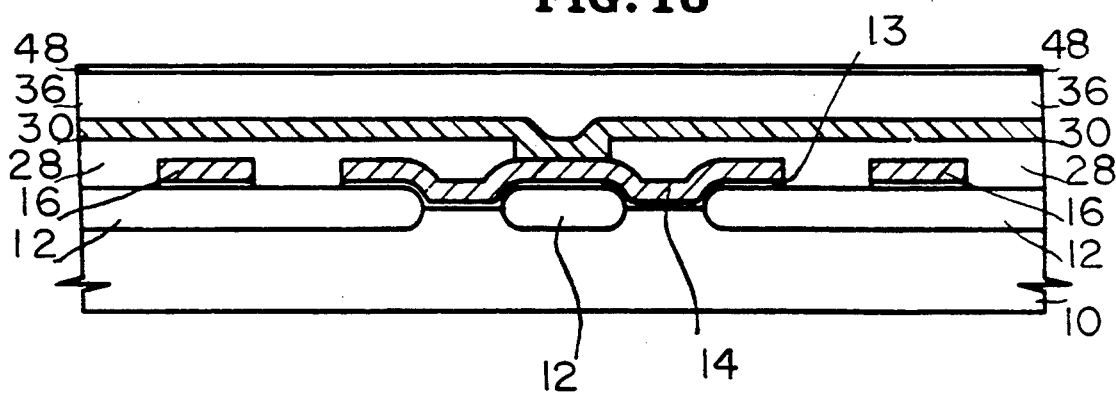
Figure 28:
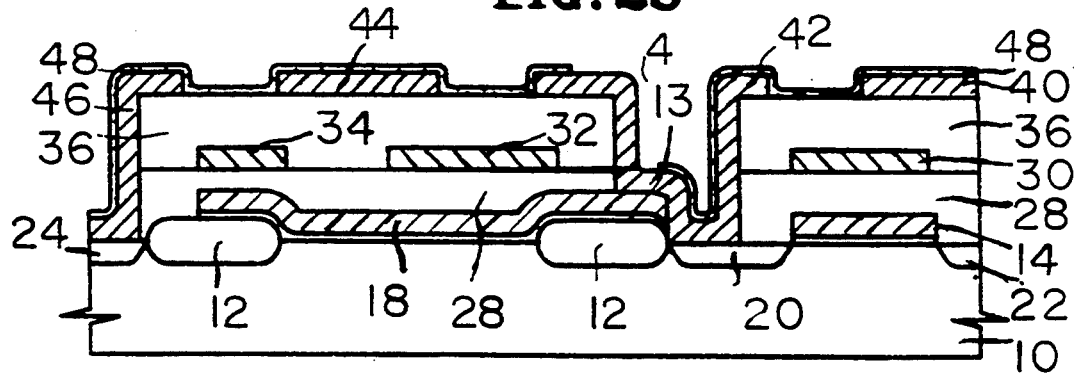

Referring to FIGS. 8, 18 and 28, an oxide film, e.g., HTO, is deposited thinly over the entire surface of the resultant structure to form a gate insulating film 48 for the first and second PMOS TFTs. The gate insulating film 48 is then selectively removed by a photo-etching process using mask patterns 160 and 162 to form respectively a ninth contact hole 4 for exposing the second PMOS TFT gate 42, and a tenth contact hole for exposing the first PMOS TFT gate 44.

The ninth contact hole 4 is for connecting the first PMOS TFT drain with the first access transistor source 20, the second PMOS TFT gate 42, and the second driver transistor gate 18. The tenth contact hole (not shown) is for connecting the second PMOS TFT drain with the second access transistor source, the first PMOS TFT gate 44, and the first driver transistor gate 16.

Figure 9:
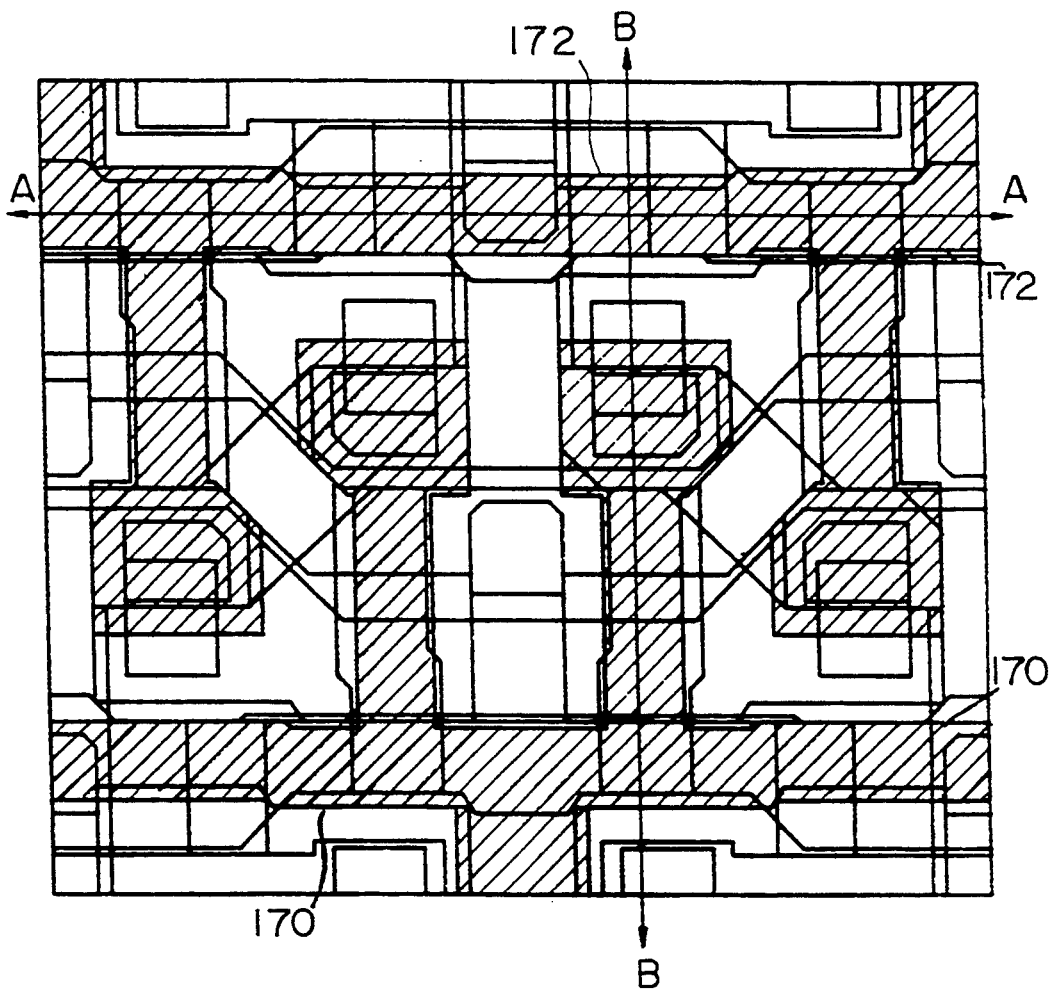
Figure 19:
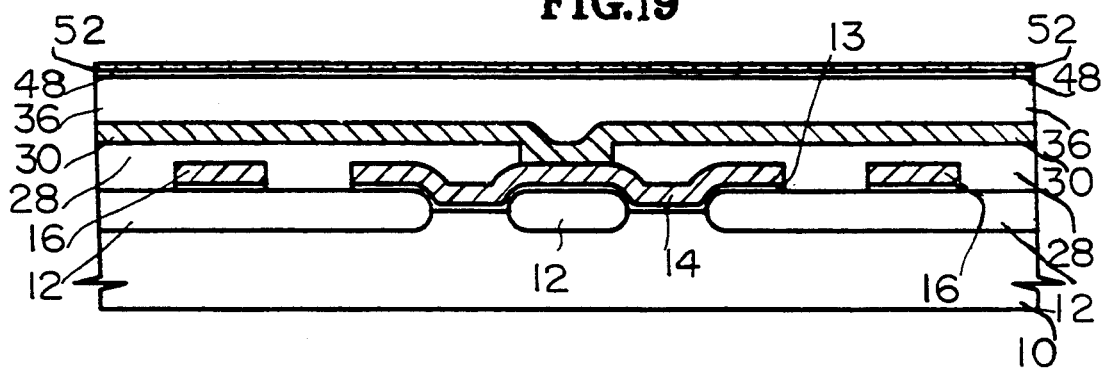
Figure 29:
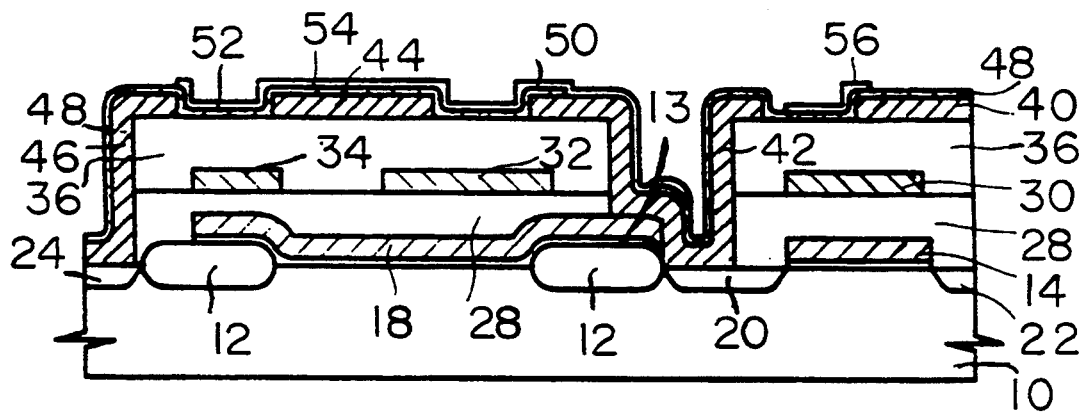

Referring to FIGS. 9, 19 and 29, an amorphous silicon is deposited over the entire surface of the resultant structure and then patterned with a conventional photo-etching process using mask patterns 170 and 172, thus respectively forming the active regions of the first and second PMOS TFTs, and the second and third power supply lines.

An impurity, e.g., boron, is then ion-implanted over the resulting structure, excluding the areas corresponding to the channels of the first and second PMOS TFT. The channels are at the upper portion of the first and second PMOS TFT gates. The active region of the first PMOS TFT will then be divided into a drain 50, a source 52 and a channel 54, and the active region of the second PMOS TFT will also be divided into a drain, a source, and a channel.

A second power supply line 52, disposed parallel to the second word line 34, is connected to the first PMOS TFT source 52. The active region of the first PMOS TFT, disposed perpendicular to the second word line 34, is connected to the second power supply line 52. The third power supply line 56, disposed parallel to the first word line 30, is connected to the second PMOS TFT source (not shown), and the active region of the second PMOS TFT, disposed perpendicular to the first word line 30, is connected to third power supply wiring 56.

Figure 10:
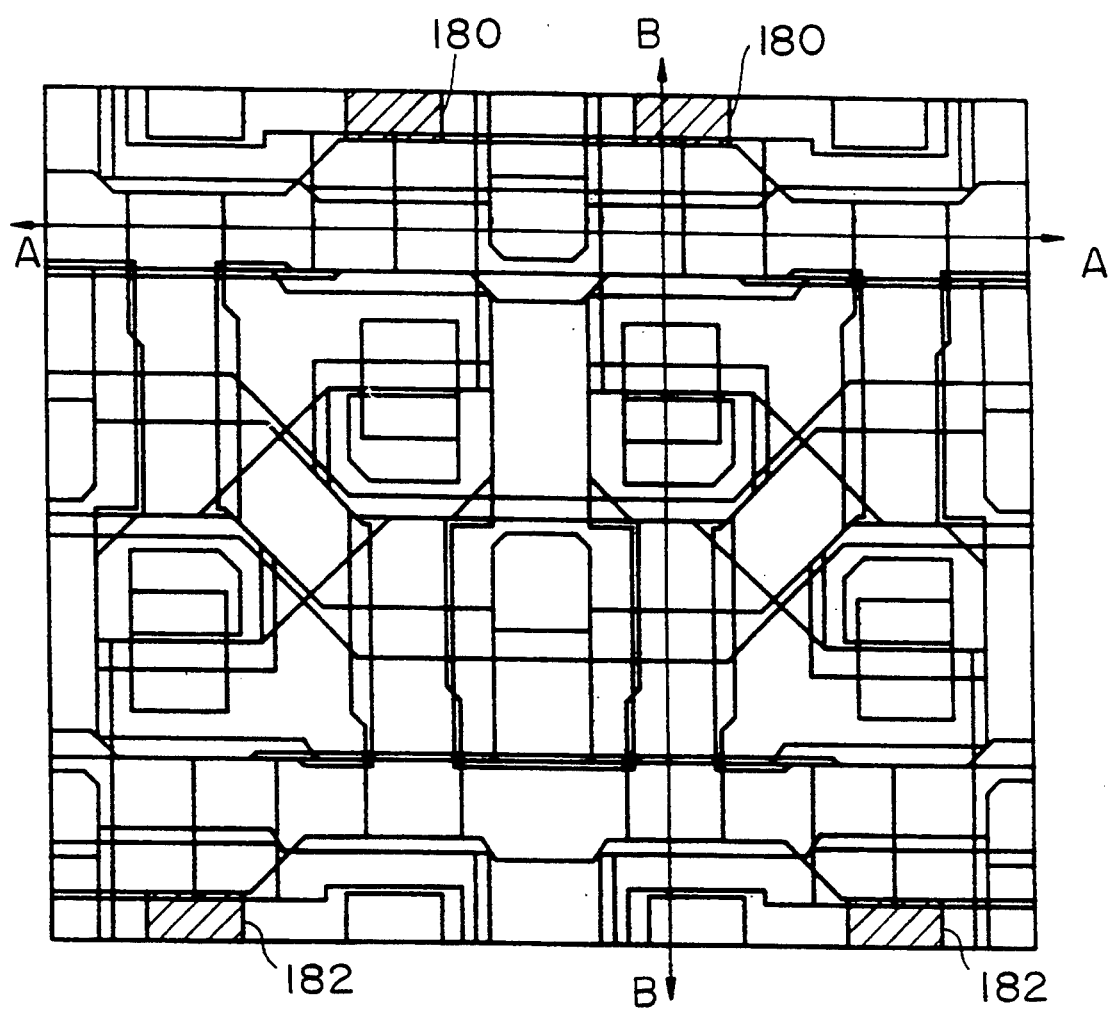
Figure 20:
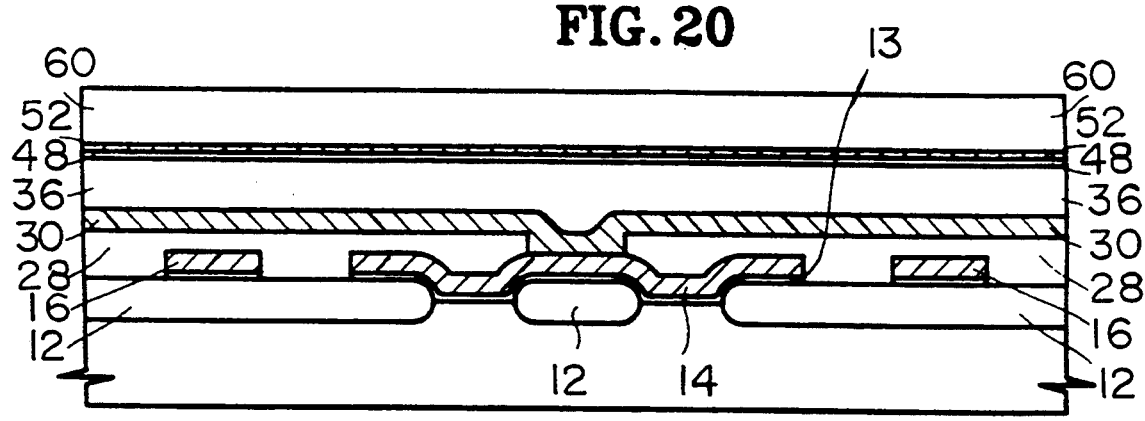
Figure 30:
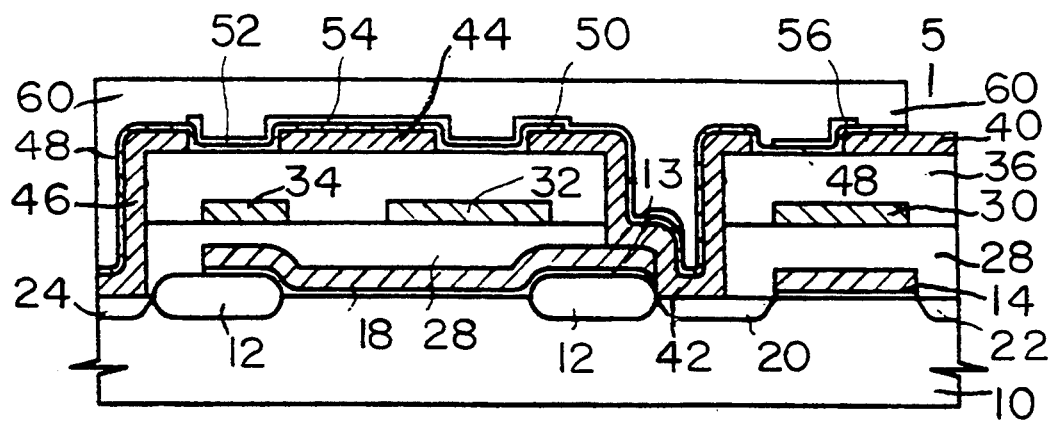

Referring to FIGS. 10, 20 and 30, a monolayer of oxide film, e.g., HTO, is deposited over the entire surface of the resultant structure to form a third insulating layer 60. The surface of the third insulating layer 60 may be planarized by laminating a BPSG insulating material over it.

The third insulating layer 60 is then selectively removed by a conventional photo-etching process using mask patterns 180 and 182, exposing the eleventh 5 and twelfth contact holes, respectively. The eleventh contact hole 5 is for exposing the surface of the first pad 40, and the twelfth contact hole is for exposing the surface of the second pad 46. The first bit line is connected to the first pad 40 through the eleventh contact hole 5, and the second bit line is connected to the second pad 46 through the twelfth contact hole.

Figure 11:
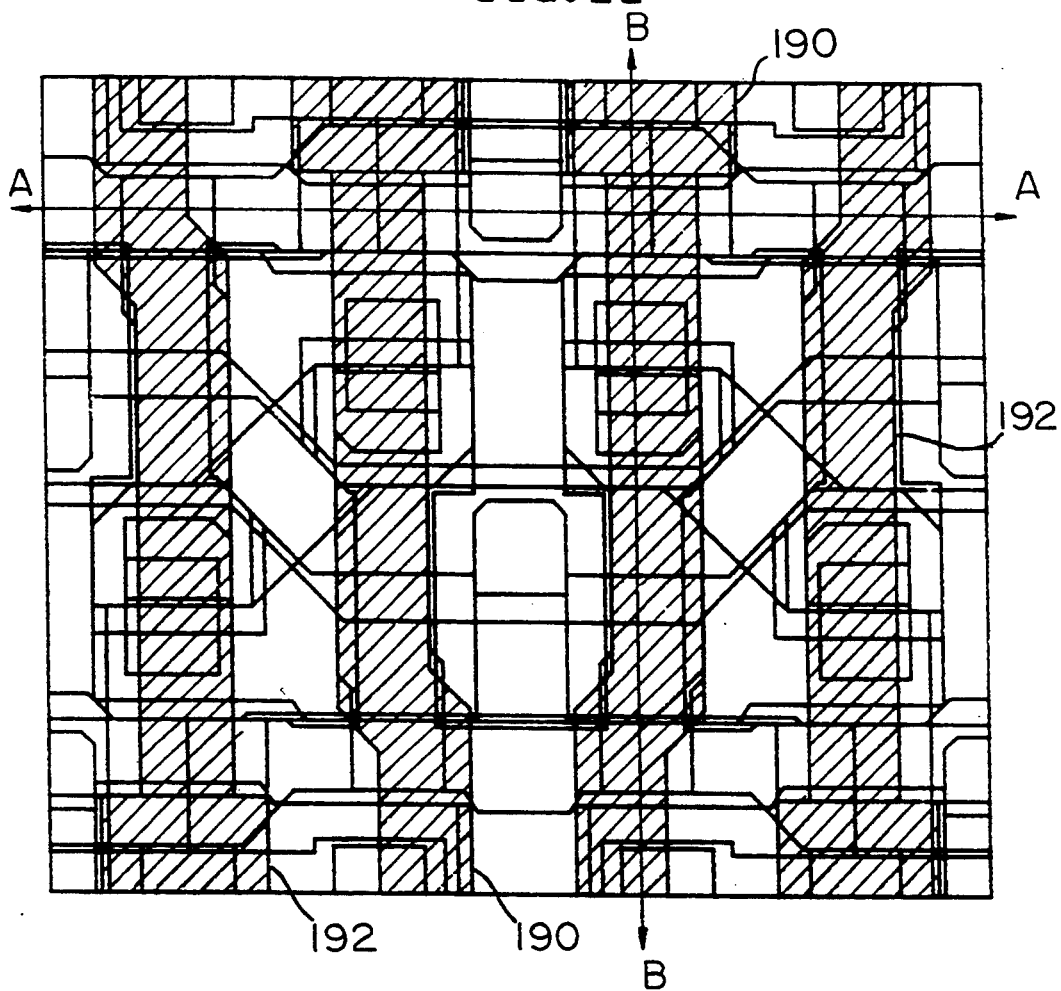
Figure 21:
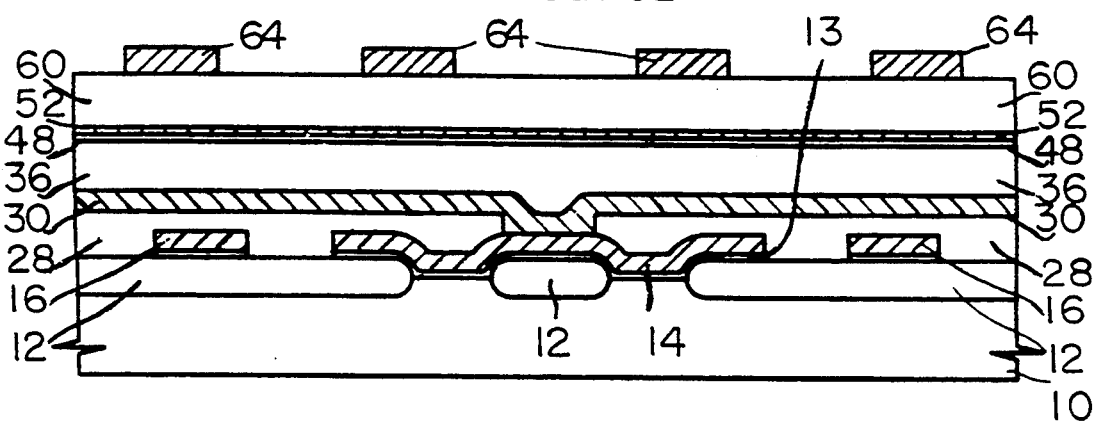
Figure 31:
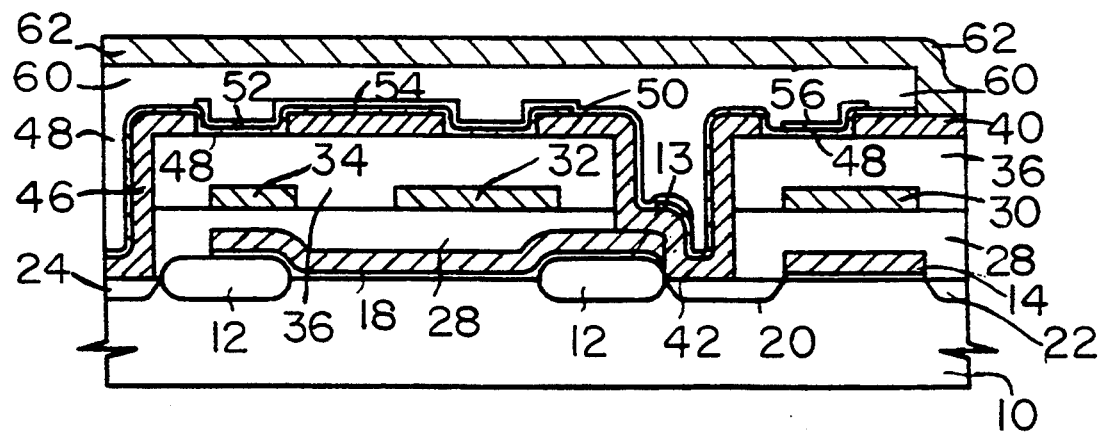

Referring to FIGS. 11, 21 and 31, a metal, e.g., aluminum, is deposited over the entire surface of the resultant structure. The metal is then patterned by a conventional photo-etching process using mask patterns 190, 192 to form the first and second bit lines 62, 64, respectively.

The first bit line 62 contacts the first pad 40 through the eleventh contact hole 5, thereby contacting the first access transistor drain 22. The second bit line 64 contacts the second pad 46 through the twelfth contact hole, thereby contacting the second access transistor drain 24. The first and second bit lines 62, 64 are formed perpendicular to the first and second word lines 30, 34, respectively.

The present embodiment was described as having PMOS TFT load elements of a bottom-gate structure. PMOS TFT's with either a top-gate or a double-gate structure can be easily substituted within the scope and spirit of the invention.

It is apparent that modifications can be made by persons skilled in the art without departing from the scope and spirit of the invention.

What is claimed is:

1. A semiconductor memory device including a first memory cell comprising:
    a semiconductor substrate;
    a first conductive layer formed on said substrate;
    a first and second access transistor each having a gate formed from said first conductive layer;
    an insulating layer formed on said first and second access transistor gates, said insulating layer having a first and second contact hole therein to expose said first and second access transistor gates, respectively;
    a second conductive layer formed on said insulating layer; and
    a first and second word line formed from said second conductive layer, said first word line being connected to said first access transistor gate through said first contact hole, and said second word line being connected to said second access transistor gate through said second contact hole.

2. A semiconductor memory device according to claim 1, wherein said first and second access transistor gates are disposed parallel to said first and second word lines, respectively.

3. A semiconductor memory device according to claim 1, further comprising:
    a second insulating layer formed on said second conductive layer, said first and second word lines being disposed on said second insulating layer; and
    a ground line formed on said second insulating layer and disposed parallel to said first word line.

4. A semiconductor memory device according to claim 1, wherein:
    said first access transistor gate of said first memory cell is connected to a first access transistor gate of an adjacent second memory cell; and
    said second access transistor gate of said first memory cell is connected to a second access transistor gate of an oppositely adjacent third memory cell;
    said first access transistor gate of said first memory cell does not contact a first access transistor gate of said third memory cell; and
    said second access transistor gate of said first memory cell does not contact a second access transistor gate of said second memory cell.

5. A semiconductor memory device according to claim 4, further comprising:
    first and second driver transistor gates disposed near a center of said first memory cell;
    wherein said first and second access transistor gates are disposed near an edge of said first memory cell.

6. A semiconductor memory device according to claim 5, wherein said first and second driver transistor gates are formed perpendicular to said first and second access transistors gates, respectively.

7. A semiconductor memory device according to claim 6, wherein:
    said first and second access transistor gates are formed perpendicular to said first and second driver transistor gates; and
    said first and second access transistor gates are formed parallel to said first and second word lines.

8. A semiconductor memory device according to claim 4, wherein:
    said first memory cell is symmetrical in formation to said second memory cell; and
    said first memory cell is symmetrical in formation to said third memory cell.

9. A semiconductor memory device according to claim 1, further comprising:
    first and second driver transistor gates disposed near a center of said first memory cell;
    wherein said first and second access transistors and said first and second driver transistors of said first memory cell are adjacent to a second memory cell.

10. A semiconductor memory device according to claim 1, further comprising a first and second load element.

11. A semiconductor memory device according to claim 10, wherein said first and second load elements are bottom-gated PMOS thin film transistors.

12. A semiconductor memory device according to claim 10, wherein said first and second load elements are top-gated PMOS thin film transistors.

13. A semiconductor memory device according to claim 10, wherein said first and second load elements are double-gated PMOS thin film transistors.

14. A semiconductor memory device according to claim 10, wherein said first and second load elements are high-resistance polysilicon.

* * * * *